(12) United States Patent
Jang

(10) Patent No.: US 10,565,920 B2
(45) Date of Patent: Feb. 18, 2020

(54) ORGANIC LIGHT EMITTING DIODE DISPLAY DEVICE AND OPERATING METHOD THEREOF

(71) Applicant: LG ELECTRONICS INC., Seoul (KR)

(72) Inventor: Joonduk Jang, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 64 days.

(21) Appl. No.: 15/996,296

(22) Filed: Jun. 1, 2018

(65) Prior Publication Data
US 2019/0139478 A1 May 9, 2019

(30) Foreign Application Priority Data
Nov. 9, 2017 (KR) .......................... 10-2017-0148999

(51) Int. Cl.
| G09G 3/30 | (2006.01) |
| G09G 3/20 | (2006.01) |
| G09G 3/3225 | (2016.01) |
| H01L 27/32 | (2006.01) |
| H01L 51/52 | (2006.01) |

(52) U.S. Cl.
CPC ......... *G09G 3/2003* (2013.01); *G09G 3/3225* (2013.01); *G09G 2300/0452* (2013.01); *G09G 2320/0257* (2013.01); *G09G 2320/043* (2013.01); *G09G 2320/0626* (2013.01); *H01L 27/3213* (2013.01); *H01L 27/3244* (2013.01); *H01L 51/5206* (2013.01); *H01L 51/5221* (2013.01); *H01L 2251/301* (2013.01); *H01L 2251/308* (2013.01)

(58) Field of Classification Search
CPC .......................... G09G 3/30–3291; G09G 3/12
See application file for complete search history.

(56) References Cited

U.S. PATENT DOCUMENTS
9,418,591 B2 8/2016 Kim et al.
9,824,631 B2 11/2017 Yamazaki et al.
(Continued)

FOREIGN PATENT DOCUMENTS
JP 2007072455 3/2007
KR 1020170003213 1/2017
(Continued)

OTHER PUBLICATIONS

PCT International Application No. PCT/KR2018/008327, International Search Report dated Oct. 18, 2018, 3 pages.

*Primary Examiner* — Sanghyuk Park
(74) *Attorney, Agent, or Firm* — Lee, Hong, Degerman, Kang & Waimey PC

(57) ABSTRACT

An organic light emitting diode display device includes a display unit including pixels including an organic light emitting diode, and a controller configured to divide a frame of a video into a plurality of blocks each including one or more pixels, sense a luminance value and a color value of each of the plurality of blocks, extract a fixed region including one or more blocks of the plurality of blocks based on the sensed luminance value and the sensed color value, and control a luminance value of one or more pixels included in the extracted fixed region and a current applied to the one or more pixels based on pixel data of the one or more pixels.

18 Claims, 14 Drawing Sheets

(56) References Cited

U.S. PATENT DOCUMENTS

| | | | | |
|---|---|---|---|---|
| 2014/0028739 A1* | 1/2014 | Takahashi | ............ | G09G 3/2003 345/690 |
| 2014/0118410 A1* | 5/2014 | Oh | ....................... | G09G 3/3208 345/690 |
| 2014/0146071 A1 | 5/2014 | Kim et al. | | |
| 2016/0217731 A1* | 7/2016 | Joo | ..................... | G09G 3/3208 |

FOREIGN PATENT DOCUMENTS

| KR | 1020170012836 | 2/2017 |
|---|---|---|
| KR | 1020170081094 | 7/2017 |

\* cited by examiner

HIL : Hole Injection Layer
HTL : Hole Transfer Layer
EML : Emitting Layer
ETL : Electron Transfer Layer

| Luminance \ Color | W | R | G | B | Cyan | Yellow | Magenta |
|---|---|---|---|---|---|---|---|
| 100% | 7.5A | 12.7A | 12.2A | 9.5A | 15A | 15A | 15A |
| 25% | 5.8A | 11.8A | 11.1A | 7.4A | 15A | 15A | 15A |

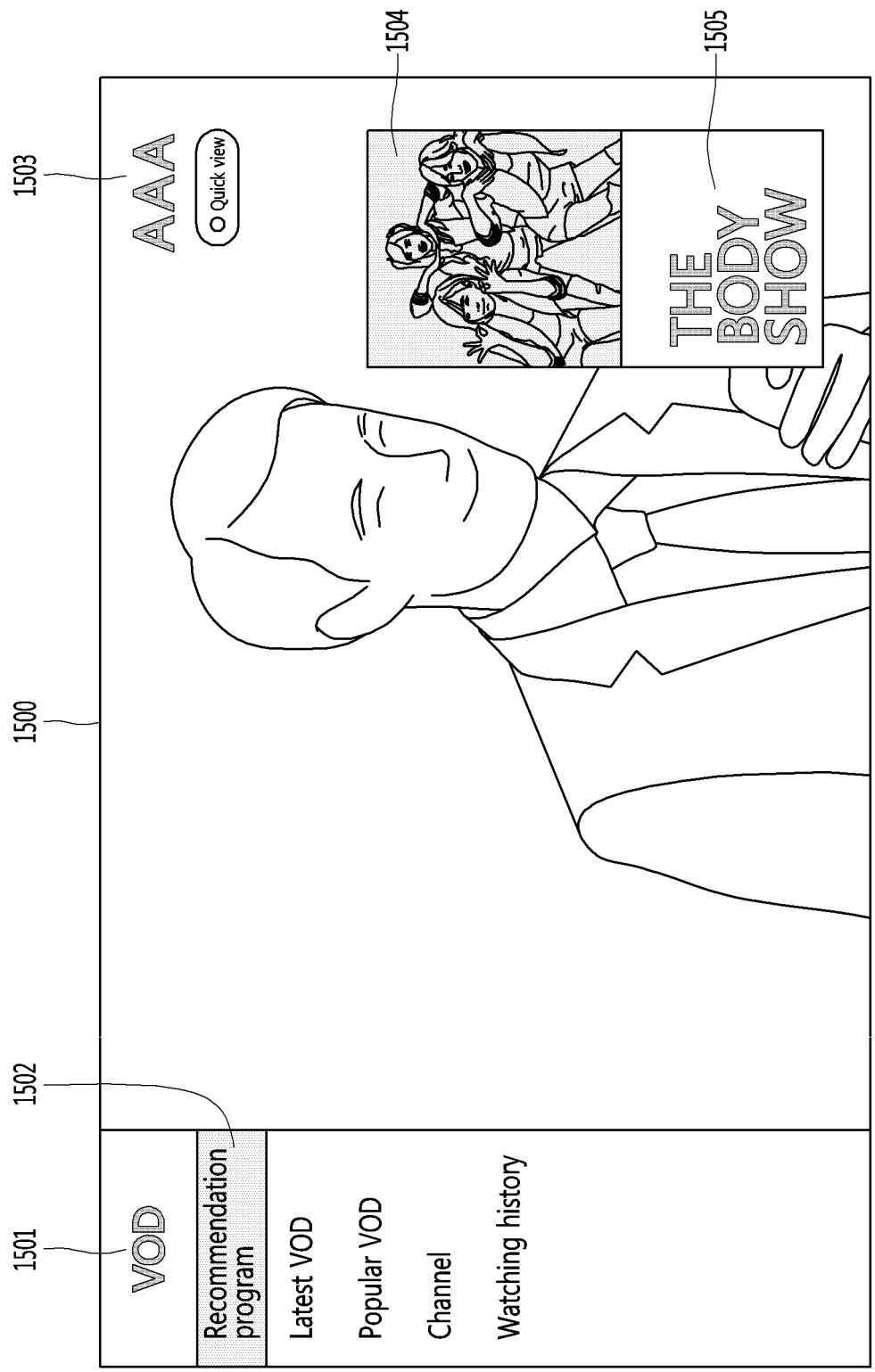

ORGANIC LIGHT EMITTING DIODE DISPLAY DEVICE AND OPERATING METHOD THEREOF

CROSS-REFERENCE TO RELATED APPLICATIONS

Pursuant to 35 U.S.C. § 119(a), this application claims the benefit of earlier filing date and right of priority to Korean Patent Application No. 10-2017-0148999, filed on Nov. 9, 2017, the contents of which are hereby incorporated by reference herein in its entirety.

BACKGROUND

The present invention relates to an organic light emitting diode (OLED) display device, and more particularly, to an OLED display device capable of preventing the generation of an afterimage of a screen displayed thereon and minimizing a reduction in a lifespan of an OLED, and an operating method thereof.

Recently, as the use of various smart devices and high-resolution large screens as well as televisions has increased, the types of display devices have been diversified. In particular, a variety of flat panel displays (FPDs) have been developed which can further reduce the weight and volume than a so-called cathode ray tube (CRT). Specifically, flat panel displays, such as liquid crystal displays (LCDs), thin film transistor-liquid crystal displays (TFT-LCDs), plasma display panels (PDPs), and electroluminescence devices have attracted attention.

The electroluminescence devices may be classified into an inorganic light emitting diode and an organic light emitting diode (OLED) according to a material of an emitting layer. The OLED is a self-luminous organic material that emits light by itself by using an electroluminescence phenomenon that light is emitted when a current flows through a fluorescent organic compound. The OLED can be driven at a low voltage and can be made light and thin. Additionally, since each device is a luminous type that emits light, light is adjusted by changing a current flowing through each device. Thus, a backlight is not required. An OLED display device implemented with such OLEDs has advantages such as a fast response time, high video quality, high luminescent efficiency, an ultra-thin structure, and a wide viewing angle.

Due to the above advantages, the prospect of the OLED display device is bright, and the demand for the OLED display device is increasing.

As each of elements of the OLED display device emits light, the frequency of use may vary according to the elements. As a result, a lifespan may vary according to the elements. For example, a logo included in broadcast content, an item of a menu screen, or the like may be continuously displayed in a state of being fixed at a specific position on a screen. Luminance of the logo or the item may be relatively high in terms of visibility. In this case, since an element in a region in which the logo or the item is displayed continuously emits high luminance light, a lifespan of the element may be rapidly reduced, compared to that of elements in other regions. When the lifespan of the element in the region is rapidly reduced, brightness of light emitted by the element may be reduced. Therefore, an afterimage may be generated on a specific screen due to a difference between brightness of an element in one region and brightness of elements in other regions, and thus, a user may be uncomfortable when viewing content through the OLED display device.

SUMMARY

Embodiments provide an organic light emitting diode display device capable of minimizing a reduction in a lifespan of corresponding pixels by extracting a fixed region including pixels of pixels thereof, outputting the same luminance value and the same color value during a certain number of continuous frames, and adjusting a luminance value or a current value with respect to each of the pixels of the fixed region.

In addition, embodiments also provide an organic light emitting diode display device capable of more efficiently extracting the fixed region including the pixels of the pixels thereof, outputting the same luminance value and the same color value during the certain number of continuous frames.

In one embodiment, an organic light emitting diode display device includes: a display unit configured to include pixels including an organic light emitting diode; and a controller configured to divide a frame of a video into a plurality of blocks each including one or more pixels, sense a luminance value and a color value of each of the plurality of blocks, extract a fixed region including one or more blocks of the plurality of blocks based on the sensed luminance value and the sensed color value, and adjust a luminance value of one or more pixels included in the extracted fixed region and a current applied to the one or more pixels based on pixel data of the one or more pixels.

The controller may sense a luminance value and a color value of a first block of the plurality of blocks by sensing an average luminance value and an average color level of one or more pixels included in the first block.

The controller may sense the luminance value and the color value of the first block by sensing an average luminance value and an average color level of at least some extracted from the one or more pixels included in the first block.

When a luminance value and a color value of a first block of the plurality of blocks are respectively the same as a luminance value and a color value in each of a certain number of continuous frames of the video, or when a difference between the luminance values and a difference between the color values are less than a reference value, the controller may extract the first block as the fixed region.

The controller may compare a luminance value and a color value of a first block of a current frame of the video with a luminance value and a color value with respect to a first block of a previous frame of the video, when the luminance values and the color values are the same, or a difference between the luminance values and a differences between the color values are less than a reference value, the controller may increase a count with respect to the first block, and when the count is greater than or equal to a threshold count, the controller may extract the first block as the fixed region.

The pixel data may include R, G, and B levels or mixed color levels of each of the one or more pixels.

The controller may extract a maximum level from R, G, and B levels of a first pixel of the one or more pixels included in the fixed region, and when the extracted maximum level is higher than or equal to a threshold level, the controller may reduce each of the R, G, and B levels of the first pixel by a certain ratio.

The controller may extract a maximum level from mixed color levels of a first pixel of the one or more pixels included in the fixed region, and when the extracted maximum level is higher than or equal to a threshold level, the controller may reduce a current applied to the first pixel.

The organic light emitting diode display device may further include a memory configured to store the luminance value and the color value sensed with respect to each of the plurality of blocks.

The organic light emitting diode display device may further include a broadcast reception unit configured to receive the video.

In another embodiment, an operating method of an organic light emitting diode display device includes: dividing a frame of an input video into a plurality of blocks each including a plurality of pixels; sensing a luminance value and a color value of each of the plurality of blocks; comparing the sensed luminance value and the sensed color value of each of the plurality of blocks with a luminance value and a color value of a corresponding block of a previous frame; extracting a fixed region with respect to the frame based on a comparison result; and adjusting the luminance value of each of the plurality of pixels or a current applied to each of the plurality of pixels based on pixel data of each of the plurality of pixels included in the fixed region.

BRIEF DESCRIPTION OF THE DRAWINGS

FIGS. 11 to 15 are illustrative views related to the operating method of the OLED display device shown in FIG. 10.

DETAILED DESCRIPTION OF THE EMBODIMENTS

Hereinafter, embodiments relating to the present invention will be described in detail with reference to the accompanying drawings. The suffixes "module" and "unit" for components used in the description below are assigned or mixed in consideration of easiness in writing the specification and do not have distinctive meanings or roles by themselves.

A display device according to an embodiment of the present invention, for example, as an intelligent display device that adds a computer supporting function to a broadcast receiving function, can have an easy-to-use interface such as a writing input device, a touch screen, or a spatial remote control device as an internet function is added while fulfilling the broadcast receiving function. Then, with the support of a wired or wireless internet function, it is possible to perform an e-mail, web browsing, banking, or game function in access to internet and computers. In order for such various functions, standardized general purpose OS can be used.

Accordingly, since various applications are freely added or deleted on a general purpose OS kernel, a display device described in this present invention, for example, can perform various user-friendly functions. The display device, in more detail, can be network TV, HBBTV, smart TV, LED TV, OLED TV, and so on and in some cases, can be applied to a smartphone.

Figure 1:
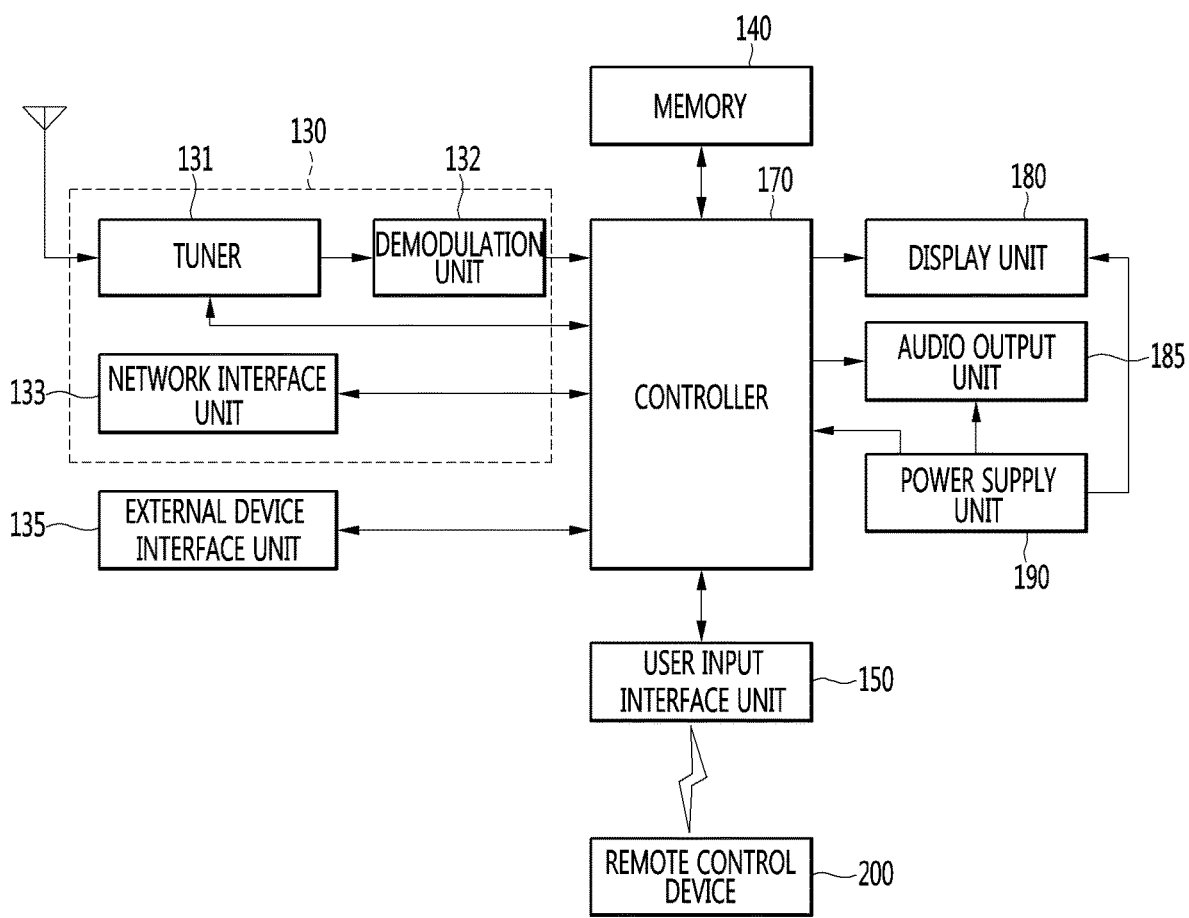
FIG. 1 is a block diagram illustrating a configuration of a display device according to an embodiment of the present invention.

FIG. 1 is a block diagram illustrating a configuration of a display device according to an embodiment of the present invention.

Referring to FIG. 1, the display device 100 may include a broadcast reception unit 130, an external device interface unit 135, a memory 140, a user input interface unit 150, a controller 170, a short-range communication unit 173, a display unit 180, an audio output unit 185, and a power supply unit 190.

The broadcast reception unit 130 may include a tuner 131, a demodulation unit 132, and a network interface unit 133.

The tuner 131 may select a specific broadcast channel according to a channel selection command. The tuner 131 may receive broadcast signals for the selected specific broadcast channel.

The demodulation unit 132 may divide the received broadcast signals into video signals, audio signals, and broadcast program related data signals and restore the divided video signals, audio signals, and data signals to an output available form.

The external device interface unit 135 may receive an application or an application list of an adjacent external device and transfer the application or the application list to the controller 170 or the memory 140.

The external device interface unit 135 may provide a connection path between the display device 100 and the external device. The external device interface unit 135 may receive an image and/or an audio outputted from the external device and transfers the image and/or the audio to the controller 170. The external device connectable to the external device interface unit 135 may be one of a set-top box, a Blue-ray player, a DVD player, a game console, a sound bar, a smartphone, a PC, a USB memory, and a home theater system.

The network interface unit 133 may provide an interface for connecting the display device 100 to a wired/wireless network including an Internet network. The network interface unit 133 may transmit or receive data to or from another user or another electronic device through an accessed network or another network linked to the accessed network.

Additionally, the network interface unit 133 may transmit a part of content data stored in the display device 100 to a user or an electronic device selected from other users or other electronic devices preregistered in the display device 100.

The network interface unit 133 may access a predetermined webpage through the accessed network or another network linked to the accessed network. That is, the network interface unit 133 may access the predetermined webpage through the network and transmit or receive data to or from a corresponding server.

The network interface unit 133 may receive content or data provided by a content provider or a network operator. That is, the network interface unit 133 may receive content (e.g., movies, advertisements, games, VOD, broadcast signals, etc.) and content-related information provided from the content provider or the network operator through the network.

Additionally, the network interface unit 133 may receive update information and update files of firmware provided by the network operator and may transmit data to the Internet or content provider or the network operator.

The network interface unit 133 may select and receive a desired application among applications, which are open to the public, through the network.

The memory 140 may store a program for signal processing and control in the controller 170 and may store signal-processed image, voice, or data signals.

Additionally, the memory 140 may perform a function for temporarily storing image, voice, or data signals inputted from the external device interface unit 135 or the network interface unit 133 and may store information on a predetermined image through a channel memory function.

The memory 140 may store an application or an application list inputted from the external device interface unit 135 or the network interface unit 133.

The display device 100 may reproduce content files (e.g., moving image files, still image files, music files, document files, application files, etc.) stored in the memory 140 so as to provide the content files to the user.

The user input interface unit 150 may transfer signals inputted by the user to the controller 170 or may transfer signals from the controller 170 to the user. For example, the user input interface unit 150 may receive and process control signals such as power on/off, channel selection, or screen setup from the remote control device 200 or may transmit control signals from the controller 170 to a remote control device 200, according to various communication methods such as Bluetooth, Ultra Wideband (WB), ZigBee, Radio Frequency (RF) communication scheme, or infrared (IR) communication scheme.

Additionally, the user input interface unit 150 may transfer, to the controller 170, control signals inputted from local keys (not shown) such as a power key, a channel key, a volume key, and a setting key.

Image signals that are image-processed by the controller 170 may be inputted to the display unit 180 and displayed as an image corresponding to the image signals. Additionally, image signals that are image-processed by the controller 170 may be inputted to an external output device through the external device interface unit 135.

Voice signals that are processed by the controller 170 may be outputted as audio to the audio output unit 185. Additionally, image signals that are processed by the controller 170 may be inputted to an external output device through the external device interface unit 135.

In addition, the controller 170 may control an overall operation of the display device 100.

Additionally, the controller 170 may control the display device 100 by a user command inputted through the user input interface unit 150 or an internal program and may connect to the network to download an application or an application list desired by the user into the display device 100.

The controller 170 may output channel information selected by the user through the display unit 180 or the audio output unit 185 together with the processed image or voice signals.

Additionally, the controller 170 may output the image signal or the voice signal, which is inputted from the external device (e.g., a camera or a camcorder) through the external device interface unit 135, to the display unit 180 or the audio output unit 185 according to an external device image reproduction command received through the user input interface unit 150.

On the other hand, the controller 170 may control the display unit 180 to display images. For example, the controller 170 may control the display unit 180 to display broadcast images inputted through the tuner 131, external input images inputted through the external device interface unit 135, images inputted through the network interface unit, or images stored in the memory 140. In this case, an image displayed on the display unit 180 may be a still image or video, and may be a 2D image or a 3D image.

Additionally, the controller 170 may perform control to reproduce content stored in the display device 100, received broadcast content, or external input content inputted from the outside. The content may be various types, such as a broadcast image, an external input image, an audio file, a still image, a connected web screen, a document file, and the like.

The short-range communication unit 173 may perform a wired or wireless communication with an external device. The short-range communication unit 173 may perform short-range communication with an external device. To this end, the short-range communication unit 173 can support short-range communication by using at least one of Bluetooth™, Radio Frequency Identification (RFID), Infrared Data Association (IrDA), Ultra Wideband (UWB), ZigBee, Near Field Communication (NFC), Wireless-Fidelity (Wi-Fi), Wi-Fi Direct, and Wireless Universal Serial Bus (USB) technologies. The short-range communication unit 173 may support wireless communication between the display device 100 and a wireless communication system, between the display device 100 and another display device 100, or between networks including the display device 100 and another display device 100 (or an external server) through wireless area networks. The wireless area networks may be wireless personal area networks.

Herein, the other display device 100 may be a mobile terminal such as a wearable device (for example, a smart watch, a smart glass, and a head mounted display (HMD)) or a smartphone, which is capable of exchanging data (or interworking) with the display device 100. The short-range communication unit 173 can detect (or recognize) a communicable wearable device around the display device 100. Furthermore, if the detected wearable device is a device authenticated to communicate with the display device 100 according to the present invention, the controller 170 may transmit at least part of data processed by the display device 100 to the wearable device through the short-range communication unit 173. Accordingly, a user of the wearable device may use the data processed by the display device 100 through the wearable device.

The display unit 180 may generate a driving signal by converting an image signal, a data signal, or an OSD signal, which is processed by the controller 170, or an image signal or a data signal, which is received by the external device interface unit 135, into R, G, and B signals.

On the other hand, the display device 100 shown in FIG. 1 is merely one embodiment of the present invention, and some of the illustrated elements may be integrated, added, or omitted according to the specification of the display device 100 to be actually implemented.

That is, if necessary, two or more elements may be integrated into one element, or one element may be divided into two or more elements. Additionally, the function performed by each block is provided for describing the embodiments of the present invention, and a specific operation or device thereof does not limit the scope of the present invention.

According to another embodiment of the present invention, the display device 100 may not include the tuner 131 and the demodulation unit 132, unlike that shown in FIG. 1, and may receive an image through the network interface unit 133 or the external device interface unit 135 and reproduce the received image.

For example, the display device 100 may be divided into an image processing device such as a set-top box for receiving a broadcast signal or content provided by various network services, and a content reproduction device for reproducing content inputted from the image processing device.

In this case, an operating method of the display device according to an embodiment of the present invention, which will be described below, may be performed by the display device 100 described above with reference to FIG. 1, or may be performed by any one of the image processing device such as the set-top box and the content reproduction device including the display unit 180 and the audio output unit 185.

Next, the remote control device according to an embodiment of the present invention will be described with reference to FIGS. 2 and 3.

Figure 2:
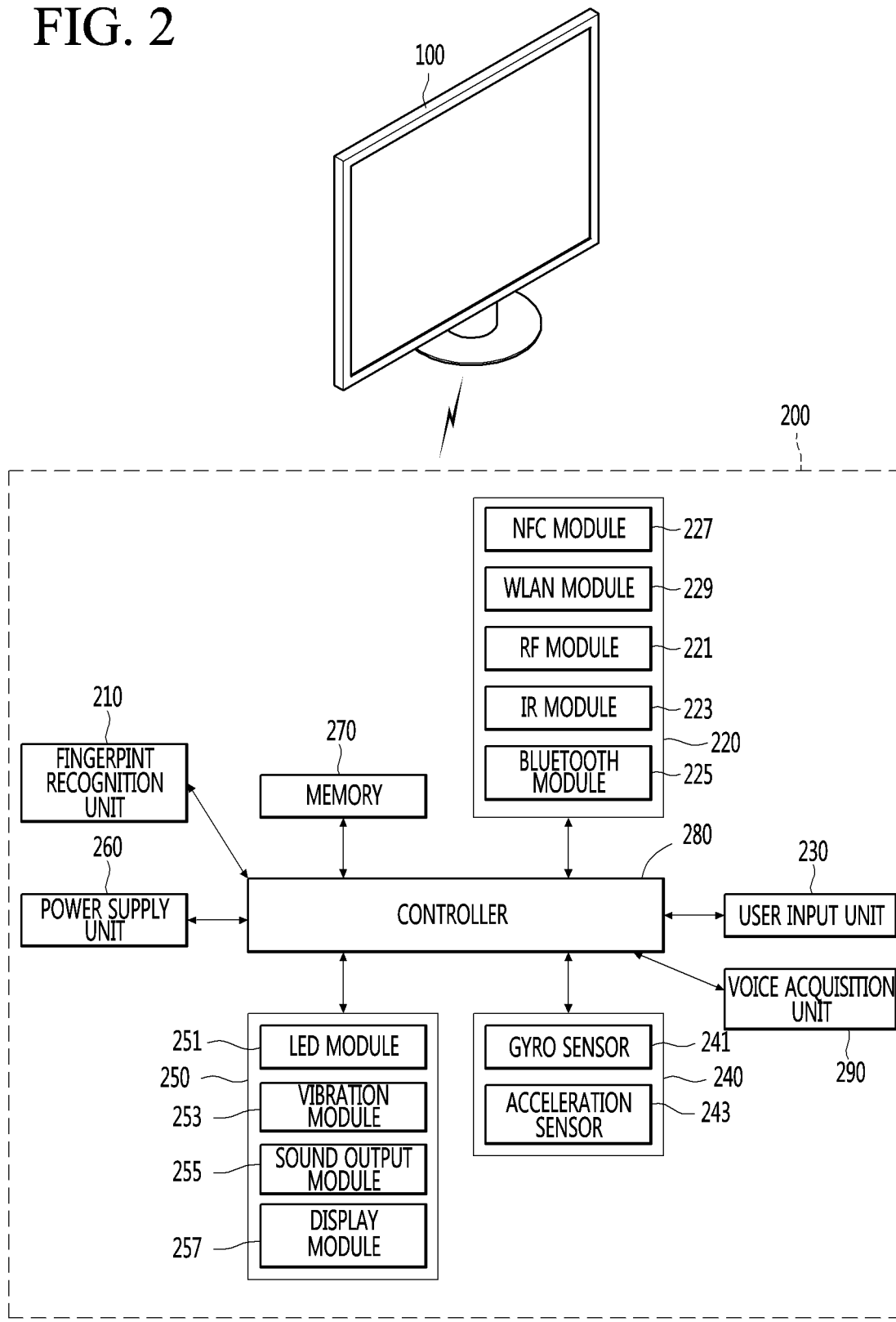
FIG. 2 is a block diagram illustrating a remote control device according to an embodiment of the present invention.
Figure 3:
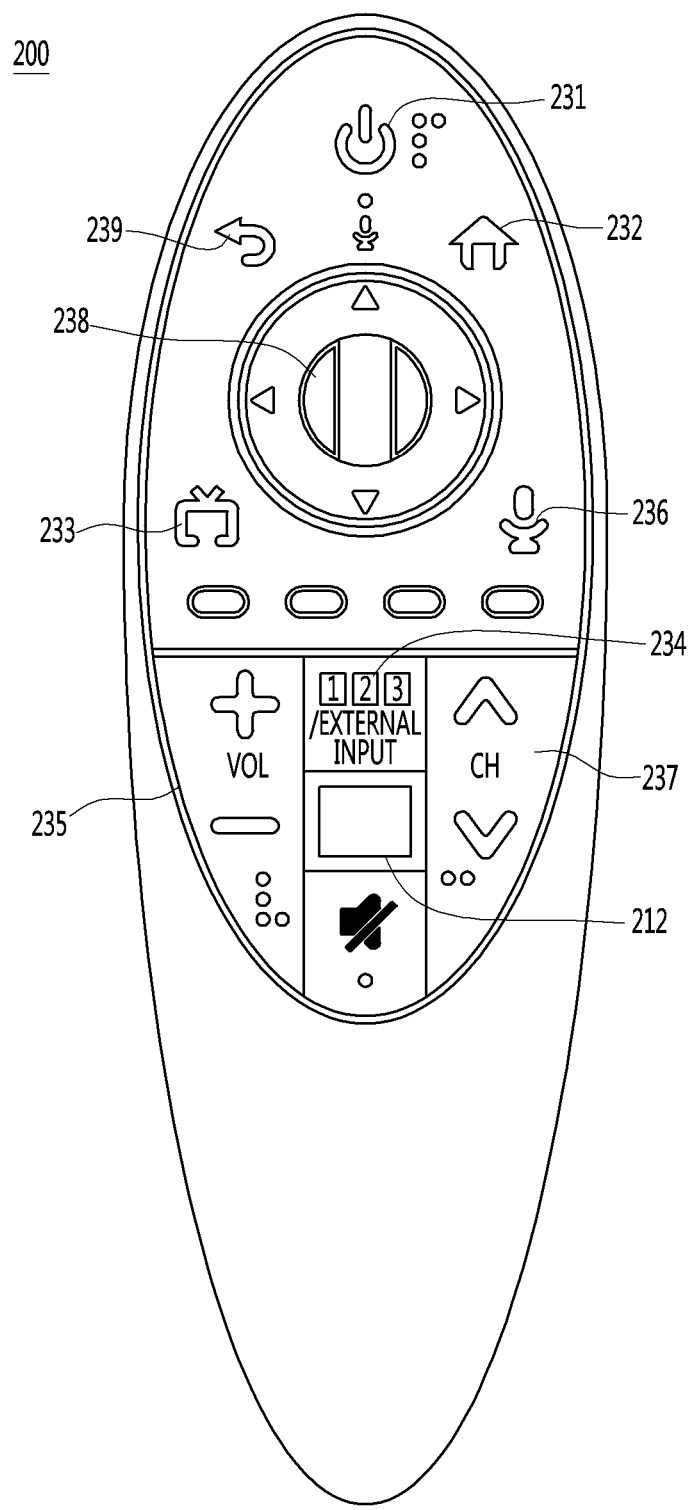
FIG. 3 is a view illustrating an actual configuration of a remote control device according to an embodiment of the present invention.

FIG. 2 is a block diagram of the remote control device 200 according to an embodiment of the present invention, and FIG. 3 illustrates an actual configuration example of the remote control device 200 according to an embodiment of the present invention.

First, referring to FIG. 2, the remote control device 200 may include a fingerprint recognition unit 210, a wireless communication unit 220, a user input unit 230, a sensor unit 240, an output unit 250, a power supply unit 260, a memory 270, a controller 280, and a voice acquisition unit 290.

Referring to FIG. 2, the wireless communication unit 220 transmits and receives a signal to and from any one of the display devices according to the aforementioned embodiments of the present invention.

The remote control device 200 may include an RF module 221 configured to transmit and receive a signal to and from the display device 100 according to an RF communication standard, and an IR module 223 configured to transmit and receive a signal to and from the display device 100 according to an IR communication standard. Additionally, the remote control device 200 may include a Bluetooth module 225 configured to transmit and receive a signal to and from the display device 100 according to a Bluetooth communication standard. Additionally, the remote control device 200 may include a Near Field Communication (NFC) module 227 configured to transmit and receive a signal to and from the display device 100 according to an NFC communication standard, and a Wireless LAN (WLAN) module 229 configured to transmit and receive a signal to and from the display device 100 according to a WLAN communication standard.

Additionally, the remote control device 200 may transmit signals containing information on a movement of the remote control device 200 to the display device 100 through the wireless communication unit 220.

On the other hand, the remote control device 200 may receive a signal transmitted by the display device 100 through the RF module 221 and, if necessary, may transmit a command for power on/off, channel change, volume change, or the like to the display device 100 through the IR module 223.

The user input unit 230 may include a keypad, a button, a touch pad, or a touch screen. The user may operate the user input unit 230 to input a command associated with the display device 100 to the remote control device 200. When the user input unit 230 includes a hard key button, the user may push the hard key button to input a command associated with the display device 100 to the remote control device 200. This will be described below with reference to FIG. 3.

Referring to FIG. 3, the remote control device 200 may include a plurality of buttons. The plurality of buttons may include a fingerprint recognition button 212, a power button 231, a home button 232, a live button 233, an external input button 234, a volume control button 235, a voice recognition button 236, a channel change button 237, a check button 238, and a back button 239.

The fingerprint recognition button 212 may be a button for recognizing a user's fingerprint. According to an embodiment, the fingerprint recognition button 212 may perform a push operation and receive a push operation and a fingerprint recognition operation. The power button 231 may be a button for turning on or off the power of the display device 100. The home button 232 may be a button for moving to a home screen of the display device 100. The live button 233 may be a button for displaying a broadcast program in real time. The external input button 234 may be a button for receiving an external input connected to the display device 100. The volume control button 235 may be a button for adjusting a volume outputted from the display device 100. The voice recognition button 236 may be a button for receiving a voice of a user and recognizing the received voice. The channel change button 237 may be a button for receiving a broadcast signal of a specific broadcast channel. The check button 238 may be a button for selecting a specific function, and the back button 239 may be a button for returning to a previous screen.

Again, FIG. 2 is described.

If the user input unit 230 includes a touch screen, a user can touch a soft key of the touch screen to input a command associated with the display device 100 to the remote control device 200. Additionally, the user input unit 230 may include various types of input units operated by a user, for example, a scroll key or a jog key, and this embodiment does not limit the scope of the present invention.

The sensor unit 240 may include a gyro sensor 241 or an acceleration sensor 243, and the gyro sensor 241 may sense information on the movement of the remote control device 200.

For example, the gyro sensor 241 may sense information on the operation of the remote control device 200 on the basis of x, y, and z axes, and the acceleration sensor 243 may sense information on a movement speed of the remote control device 200. Moreover, the remote control device 200 may further include a distance measurement sensor and sense a distance from the remote control device 200 to the display unit 180 of the display device 100.

The output unit 250 may output image or voice signals in response to operation of the user input unit 230 or image or voice signals corresponding to signals transmitted from the display device 100. A user can recognize whether the user input unit 230 is operated or the display device 100 is controlled through the output unit 250.

For example, the output unit 250 may include an LED module 251 for flashing, a vibration module 253 for generating a vibration, a sound output module 255 for outputting a sound, or a display module 257 for outputting an image, if the user input unit 230 is operated or signals are transmitted and received to and from the display device 100 through the wireless communication unit 220.

Additionally, the power supply unit 260 supplies power to the remote control device 200 and, if the remote control device 200 does not move during a predetermined period of time, stops supplying power, so that power waste can be reduced. The power supply unit 260 may resume the supply of power if a predetermined key provided in the remote control device 200 is operated.

The memory 270 may store various types of programs and application data necessary for the control or operation of the remote control device 200. If the remote control device 200 transmits and receives signals wirelessly through the display device 100 and the RF module 221, the remote control device 200 and the display device 100 transmit and receive signals through a predetermined frequency band.

The controller 280 of the remote control device 200 may store, in the memory 270, information on a frequency band for transmitting and receiving signals wirelessly to and from the display device 100 paired with the remote control device 200 and refer to the information.

The controller 280 controls the overall operation of the remote control device 200. The controller 280 may transmit a signal corresponding to a predetermined key operation of the user input unit 230 or a signal corresponding to a movement of the remote control device 200 sensed by the sensor unit 240 to the display device 100 through the wireless communication unit 220.

Additionally, the voice acquisition unit 290 of the remote control device 200 may obtain a voice.

The voice acquisition unit 290 may include at least one microphone 291 and acquire a voice through the microphone 291.

Figure 4:
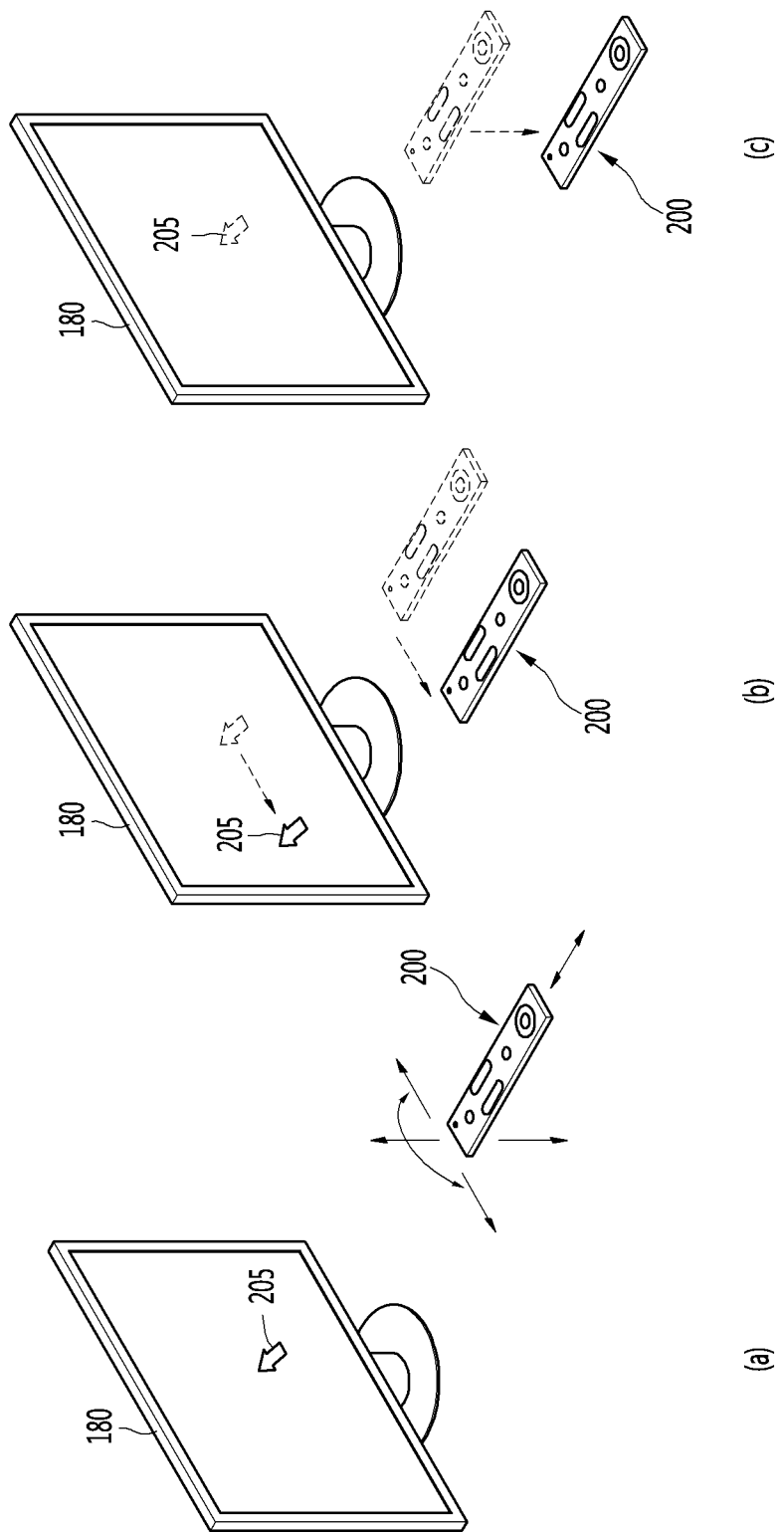
FIG. 4 is a view of utilizing a remote control device according to an embodiment of the present invention.

Next, FIG. 4 is described.

FIG. 4 illustrates an example of utilizing the remote control device according to an embodiment of the present invention.

FIG. 4A illustrates an example in which a pointer 205 corresponding to the remote control device 200 is displayed on the display unit 180.

A user can move or rotate the remote control device 200 vertically or horizontally. The pointer 205 displayed on the display unit 180 of the display device 100 corresponds to the movement of the remote control device 200. Since the pointer 205 is moved and displayed according to a movement on a 3D space as shown in the drawing, the remote control device 200 may also be referred to as a spatial remote control device.

FIG. 4B illustrates an example in which if a user moves the remote control device 200 to the left, the pointer 205 displayed on the display unit 180 of the display device 100 is also moved to the left according to the movement of the remote control device 200.

Information on the movement of the remote control device 200 detected through a sensor of the remote control device 200 is transmitted to the display device 100. The display device 100 may calculate the coordinates of the pointer 205 from the information on the movement of the remote control device 200. The display device 100 may display the pointer 205 at a position corresponding to the calculated coordinates.

FIG. 4C illustrates an example in which while a specific button in the remote control device 200 is pressed, a user moves the remote control device 200 away from the display unit 180. Due to this, a selection area in the display unit 180 corresponding to the pointer 205 may be zoomed in and displayed larger.

On the contrary, if a user moves the remote control device 200 in a direction closer to the display unit 180, a selection area in the display unit 180 corresponding to the pointer 205 may be zoomed out and displayed in a reduced size.

On the other hand, if the remote control device 200 is moved away from the display unit 180, a selection area may be zoomed out, and if the remote control device 200 is moved closer to the display unit 180, a selection area may be zoomed in.

Additionally, if a specific button in the remote control device 200 is pressed, recognition of a vertical or horizontal movement may be excluded. That is, if the remote control device 200 is moved away from or closer to the display unit 180, the up, down, left, or right movement may not be recognized and only the back and forth movement may be recognized. While a specific button in the remote control device 200 is not pressed, only the pointer 205 is moved according to the up, down, left, or right movement of the remote control device 200.

The moving speed or moving direction of the pointer 205 may correspond to the moving speed or moving direction of the remote control device 200.

On the other hand, the pointer 205 in this specification means an object displayed on the display unit 180 in response to the operation of the remote control device 200. Accordingly, besides an arrow form displayed as the pointer 205 in the drawing, various forms of objects are possible. For example, the above concept includes a point, a cursor, a prompt, and a thick outline. The pointer 205 may be displayed corresponding to one point of a horizontal axis and a vertical axis on the display unit 180 and can also be displayed corresponding to a plurality of points such as a line and a surface.

Next, a driving principle of an OLED will be described with reference to FIG. 5.

Figure 5:
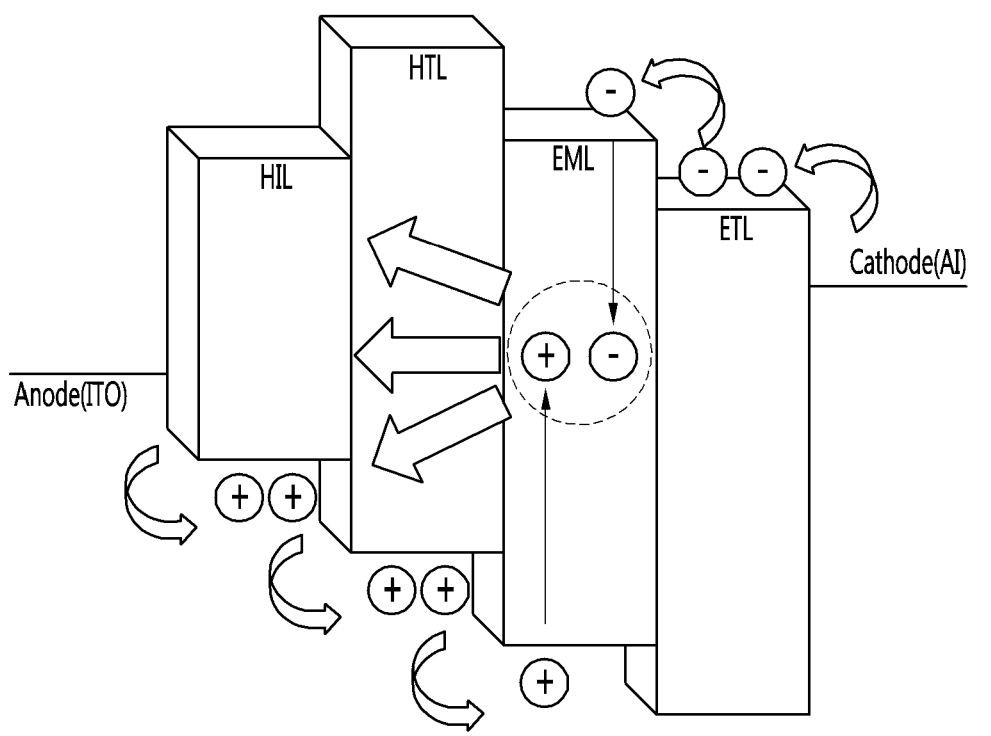
FIG. 5 is a view for describing a driving principle of an OLED included in an OLED display device according to the present invention.

FIG. 5 is a view for describing a driving principle of an OLED included in an OLED display device according to the present invention.

An OLED has a structure in which a transparent indium tin oxide (ITO) anode layer is formed on a transparent substrate such as glass, and a multi-layered thin film of organic materials having different transport capabilities and a cathode of an Mg—Ag alloy are sequentially formed on the anode layer.

The anode layer includes an anode and a cathode, and the anode layer includes a transparent electrode, such as ITO, so that light generated in an emitting layer is transmitted toward the outside. Since the OLED is a charge injection type light emitting device, charge injection efficiency between interfaces is a factor that has the greatest influence on the performance of the device.

The emitting layer (EML) is a layer in which holes (+) passing through the anode and electrons (−) passing through the cathode recombine to generate light.

Specifically, in the OLED, as a voltage is applied between two electrodes, holes and electrons are injected from the anode and the cathode, respectively, and when the holes and the electrons reach the emitting layer, the holes and the electrons recombine in the emitting layer to form excitons of an excited state. Light is obtained by emission recombination of the excitons and becomes a ground state. At this time, an emission wavelength is determined by energy of exciton, that is, an energy difference between HOMO and LUMO, and the generated light is emitted toward the transparent electrode (anode). The light generated in the emitting layer emits red, blue, and green colors, and a spectrum thereof is determined according to bond energy in the emitting layer. Therefore, an emission color is determined according to a material for forming the emitting layer.

Additionally, the OLED further includes a hole injection layer (HIL), a hole transfer layer (HTL), and an electron transfer layer (ETL), which enable the holes and the electrons to be easily moved to the emitting layer.

The hole transfer layer uses an electron donating molecule having small ionization potential so as to facilitate hole injection from the anode. Diamine, triamine, or tetramine derivatives having triphenylamine as a basic are mainly used.

The electron transfer layer is a layer that smoothly transfers electrons supplied from the cathode to the emitting layer and suppresses the movement of holes not bonded in the emitting layer, thereby increasing recombination probability in the emitting layer. The electron transfer layer is required to have excellent electron affinity and adhesion to the cathode electrode.

Next, the operation of a pixel circuit, to which the OLED is connected, will be described with reference to FIG. 6.

Figure 6:
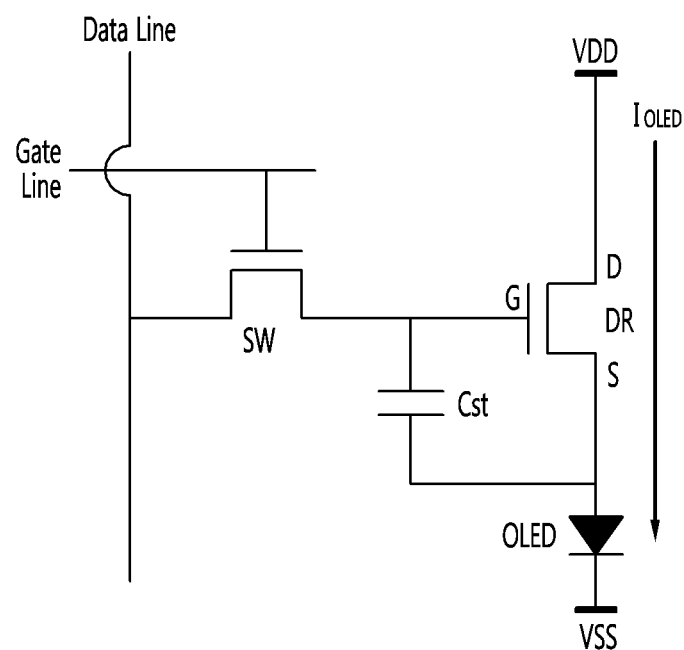
FIG. 6 is an equivalent circuit diagram of a pixel to which the OLED of FIG. 5 is connected, according to an embodiment of the present invention.

FIG. 6 is an equivalent circuit diagram of a pixel to which the OLED of FIG. 5 is connected, according to an embodiment.

The pixel of the OLED display device generally includes two transistors and one capacitor (2T1C). Specifically, referring to FIG. 6, the pixel of the OLED display device includes a data line and a gate line intersecting with each other, a switch TFT SW, a drive TFT DR, and a storage capacitor Cst.

The switch TFT SW is turned on in response to a scan pulse from the gate line so that a current path is formed between a source electrode and a drain electrode thereof. During on-time duration of the switch TFT SW, a data voltage from the data line is applied to a gate electrode of the drive TFT DR and one electrode of the storage capacitor Cst through the source electrode and the drain electrode of the switch TFT SW.

The storage capacitor Cst stores a difference voltage between the data voltage and a high-potential driving voltage VDD and constantly maintains the difference voltage during one frame period, and the drive TFT DR controls a current IOLED flowing through the OLED according to the data voltage applied to the gate electrode thereof.

The source-drain voltage of the TFT is determined by the driving voltage VDD applied to the OLED.

Figures 7, 8:
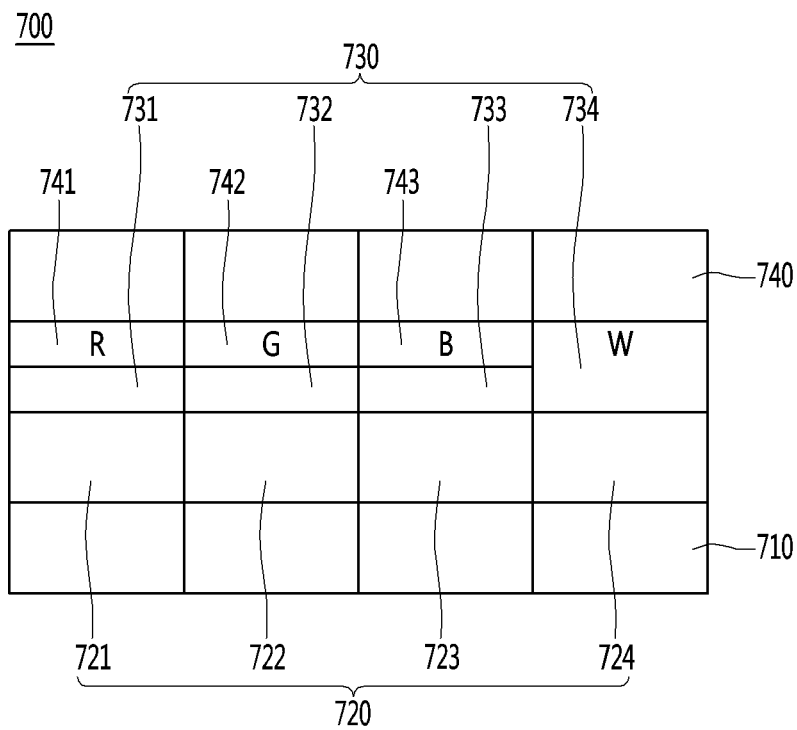
FIG. 7 is a cross-sectional view illustrating an embodiment of a pixel of an OLED display device.
FIG. 8 is a table showing an embodiment of driving current values according to colors of an OLED display device.

FIG. 7 is a partial cross-sectional view illustrating an organic light emitting diode (OLED) display device 700 according to an embodiment of the present invention, and FIG. 8 is a table showing an embodiment of driving current values according to colors of the OLED display device 700.

Referring to FIG. 7, the OLED display device 700 may include a lower substrate 710 on which a plurality of thin film transistors are formed, an organic emission layer 720 formed on the lower substrate 710, a light transmitting pattern 730 formed on the organic emission layer 720, first, second, and third color filers 741, 742, and 743 formed to respectively correspond to partial regions of the organic emission layer 720, and a glass 740 disposed on the organic emission layer 720 and the first, second, and third color filers 741, 742, and 743 to protect inner elements. Although not shown, the OLED display device 700 may further include a plurality of electrodes connected to the plurality of thin film transistors of the lower substrate 710 and black matrixes formed between emission regions R, G, B, and W.

In the OLED display device 700 according to embodiments of the present invention, red emission parts 721, 731, and 741, green emission parts 722, 732, and 742, blue emission parts 723, 733, 743, and white emission parts 724 and 734 may be defined every pixels.

The organic emission layer 720, i.e., each of first to fourth organic emission layers 721 to 724 may be formed by vertically stacking a blue OLED emitting blue light, a green OLED emitting green light, and a red OLED emitting red light. In this case, since each of the blue, green, and red OLEDs emits light, white light may be emitted from the organic emission layer 720.

Light transmitting patterns 731 to 734 may be made of a transparent material, i.e., photo acryl having excellent light transmittance or a resin material including one or more photo acryl compounds.

The first, second, and third color filters 741, 742, and 743 may each emit light corresponding to any one of a red color, a green color, and a blue color to the outside by filtering white light emitting from the first, second, third organic emission layers 721, 722, and 723 respectively corresponding thereto. For example, the first color filter 741 may emit red light to the outside, the second color filter 742 may emit green light to the outside, and the third color filter 743 may emit blue light to the outside. Meanwhile, since a color filter is not implemented in a white emission region W, white light emitted from the fourth organic emission layer 724 may be emitted to the outside.

On the other hands, the light transmitting patterns 731 to 734 may have the same thickness or different thicknesses. More specifically, since a color filter is not formed in the white emission region W, the light transmitting pattern 734 included in the white emission region W may be thicker than the light transmitting patterns 731, 732, and 733 of the remaining emission regions R, G, and B. Therefore, a gap may be constantly maintained throughout a whole region between the lower substrate 710 and the glass 740. According to embodiments, in consideration of convenience of a process, the light transmitting patterns 730 (731, 732, and 733) may be formed to have the same thickness. In this case, a height difference corresponding to a thickness of each of the first, second, and third color filters 741, 742, and 743 may be generated between the white emission region W and the remaining emission regions R, G, and B. However, the height difference may be removed by forming a water barrier film or the like.

Each of the first to fourth organic emission layers 721 to 724 may or may not emit light according to a color expressed by a corresponding pixel. For example, when the corresponding pixel expresses a red color, only the first organic emission layer 721 emits light, and the second to fourth organic emission layers 722 to 724 may not emit light. That is, a driving current with respect to a specific pixel may vary based on a color expressed by the specific pixel.

Referring to FIG. 8, when a pixel express three primary colors R, G, and B, and a white color W, only any one of the first to fourth organic emission layers 721 to 724 may emit light. Alternatively, when a pixel expresses mixed colors (for example, a cyan color C, a yellow color Y, and a magenta color M), at least two of the first to fourth organic emission layers 721 to 724 may emit light. That is, since a plurality of organic emission layers emit light so as to express the mixed colors, when the mixed colors (cyan color C, yellow color Y, and magenta color M) are expressed, a driving current of a pixel is increased compared to when the three primary colors R, G, and B, and the white color W are expressed.

In addition, when the three primary colors R, G, and B, and the white color W are expressed, a driving current may be decreased as luminance is lowered. On the contrary, in the case of the mixed colors, although a color having low luminance is expressed, a driving current may not be reduced.

As a driving current of a pixel is increased, a temperature of the organic emission layer 720 may be increased. As the temperature of the organic emission layer 720 is increased, a lifespan of an OLED element included in the organic emission layer 720 may be rapidly reduced. In addition, as luminance of a pixel becomes higher, the lifespan of the OLED element may be rapidly reduced.

Furthermore, a logo included in broadcast content, an item (icon, text, or the like) of a menu screen, or the like may be continuously displayed in a state of being fixed at a specific position on a screen of a display device, and luminance of the logo or the item may be relatively high in terms of visibility. In this case, since an OLED element, included in a pixel of a region in which the logo or the item is displayed, continuously emits high luminance light, a lifespan thereof may be rapidly reduced compared to OLED elements included in pixels of other regions. Therefore, an afterimage may be generated on a specific screen due to a difference between brightness of an element in one region and brightness of elements in other regions, and thus, a user may be uncomfortable when viewing content through an OLED display device.

Hereinafter, an OLED display device 100 and an operating method thereof according to embodiments of the present invention, provided to solve the above problems, will be described with reference to FIGS. 9 to 15.

Figure 9:
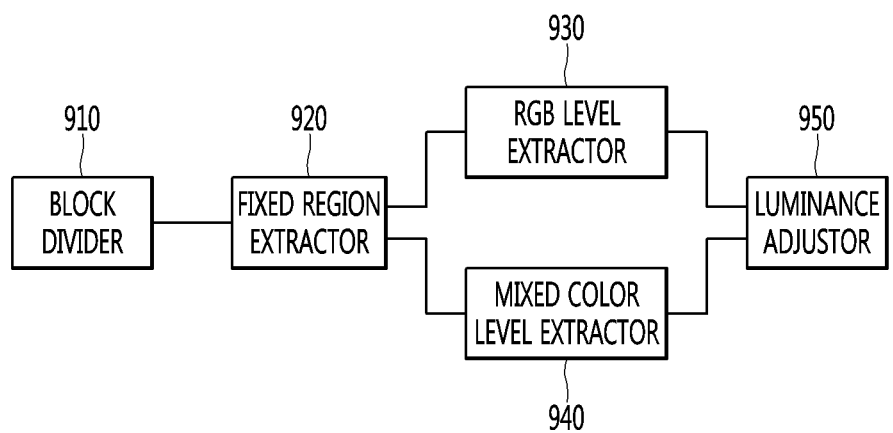
FIG. 9 is a schematic block diagram illustrating elements for implementing an operating method of an OLED display device, according to an embodiment of the present invention.

FIG. 9 is a schematic block diagram illustrating elements for implementing the operating method of the OLED display device 100, according to an embodiment of the present invention.

Referring to FIG. 9, the OLED display device 100 (hereinafter, referred to as a display device) may include a block divider 910, a fixed region extractor 920, an RGB level extractor 930, a mixed color level extractor 940, and a luminance adjuster 950. The respective elements 910 to 950 shown in FIG. 9 are separately illustrated so as to describe respective operations of the display device 100 according to embodiments of the present invention, and each of the elements 910 to 950 may not be implemented as a separate module or a separate device. For example, the elements 910 to 950 may be implemented in software so as to be performed by a controller 170 of the display device 100 or may be implemented in the form of a circuit inside of the controller 170 or the display device 100.

The block divider 910 may divide each frame of an input video into a plurality of blocks. In an example, for convenience of description, when the input video has UHD resolution of 3840×2160, the block divider 910 may divide each frame of the input video into 96×54 (5,184) blocks having a pixel size of 40×40.

The fixed region extractor 920 may sense a luminance value and a color value with respect to each of the blocks divided by the block divider 910. For example, the fixed region extractor 920 may sense an average luminance value of a corresponding block based on a luminance signal (Y of a YUV format) of each of pixels included in the corresponding block. In addition, the fixed region extractor 920 may sense an average color value of the corresponding block based on R, G, and B levels or color difference signals (U and V of the YUV format) of each of the pixels included in the corresponding block. The average luminance value and the average color value may mean an average picture level (APL) with respect to the corresponding block. The APL may be defined as an average luminance value of the brightest color in a block. According to embodiments, the fixed region extractor 920 may extract some pixels from pixels included in a block and may sense an average luminance value and an average color value of the extracted pixels.

The fixed region extractor 920 may sense the luminance value and the color value with respect to each of the blocks of each frame of the video and may extract a fixed region in the input video based on a sensing result. The fixed region may mean a region in which luminance values and/or color values sensed with respect to blocks of a predetermined number of continuous frames of a video are the same. The same luminance value and/or the same color value may mean a case where sensed luminance values are completely the same and/or sensed color values are completely the same, or a case where a difference between the sensed luminance values and/or a difference between the sensed color values are less than a reference value or greater than or equal to the reference value.

For example, in order to extract the fixed region of the video, when luminance values and/or color values of all pixels are sensed, the number of operations of the controller 170 may be excessively increased. Thus, a processing speed may be reduced. Therefore, in the case of the present invention, the block divider 910 may divide each frame of a video into a plurality of blocks, and the fixed region extractor 920 may sense a luminance value and/or a color value with respect to each of the divided blocks, thereby efficiently reducing the number of operations of the controller 170 to prevent a reduction in a processing speed.

The RGB level extractor 930 and the luminance adjuster 950 may extract R, G, and B levels of each of pixels included in the fixed region and may adjust each of the R, G, and B levels of each of the pixels based on the extracted R, G, and B levels.

Specifically, the RGB level extractor 930 may extract a maximum level (having a maximum value) from the extracted R, G, and B levels with respect to each of the pixels. The luminance adjustor 950 may compare the extracted maximum level with a threshold level. As a comparison result, when the maximum level is higher than the threshold level, the luminance adjustor 950 may adjust each of R, G, and B levels of a corresponding pixel. The comparison operation may also be performed by the RGB level extractor 930.

In an example, when the extracted maximum level is higher than the threshold level, the luminance adjustor 950 may reduce each of the R, G, and B levels of a corresponding pixel by a certain ratio. When R, G, and B levels of a first pixel are respectively about 200, about 180, and about 120, the maximum level may be about 200. Since the maximum level is higher than the threshold level (for example, about 160), the luminance adjustor 950 may reduce each of the R, G, and B levels of the first pixel by a certain ratio (for example, about 40%). As a result, the R, G, and B levels of the first pixel may be reduced to about 120, about 108, and about 72, respectively.

The mixed color level extractor 940 and the luminance adjustor 950 may extract mixed color levels (C, Y, and M) of each of the pixels included in the fixed region and may adjust a current applied to each of the pixels based on the extracted mixed color levels.

Specifically, the mixed color level extractor 940 may extract a maximum level from the extracted mixed color levels with respect to each of the pixels included in the fixed region. The luminance adjustor 950 may compare the extracted maximum level with a threshold level. As a comparison result, when the maximum level is higher than the threshold level, the luminance adjustor 950 may adjust a current applied to a corresponding pixel. The comparison operation may also be performed by the mixed color level extractor 940. For example, when a maximum level of mixed color levels of the first pixel is higher than the threshold level, the luminance adjustor 950 may reduce a current applied to the first pixel from about 15 A to about 10 A.

That is, the luminance adjustor 950 may adjust a luminance value of a corresponding pixel or a current applied to the corresponding pixel based on pixel data of a pixel included in the fixed region. The pixel data may include R, G, B levels and/or mixed color levels. When the pixel data includes the R, G, and B levels, the luminance adjustor 950 reduce a luminance value of a corresponding pixel to improve a lifespan of the corresponding pixel by adjusting R, G, and B levels based on a maximum level of the R, G, B levels of the corresponding pixel. In addition, when the pixel data includes the mixed color levels, the luminance adjustor 950 reduce heat generated in a corresponding pixel to improve a lifespan of the corresponding pixel by adjusting a current applied to the corresponding pixel based on a maximum level of mixed R, G, B levels of a pixel included in the fixed region. Since a lifespan of a pixel is improved according to control of the luminance adjustor 950, it is possible to reduce a phenomenon in which an afterimage is generated on a display unit 180.

An operation of the display device 100 according to the embodiment of the present invention, described with reference to FIG. 9, will be described in more detail with reference to FIG. 10.

Figure 10:
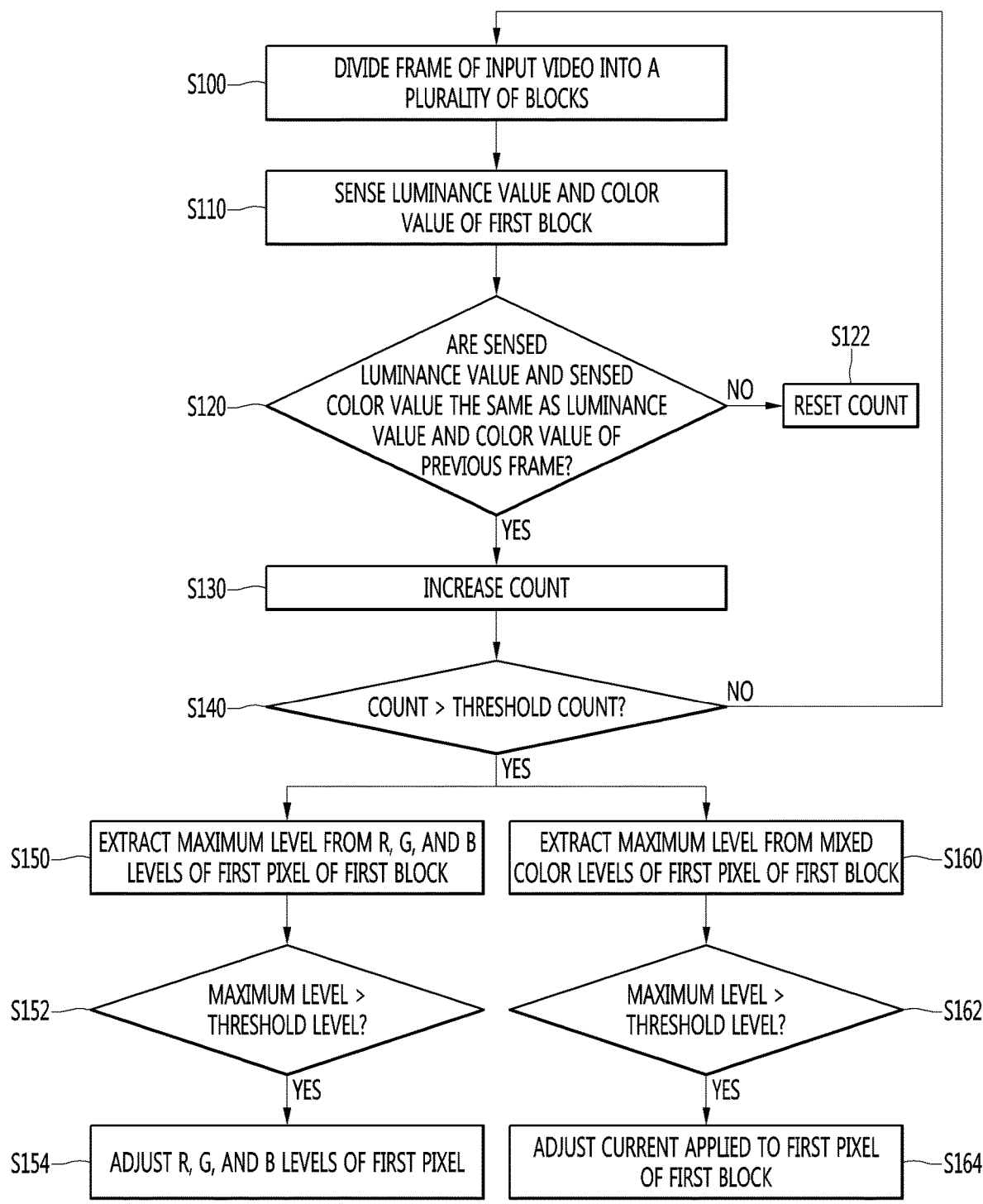
FIG. 10 is a flowchart illustrating an operating method of an OLED display device, according to an embodiment of the present invention.

FIG. 10 is a flowchart illustrating an operating method of the display device 100, according to an embodiment of the present invention.

Hereinafter, in FIG. 10, for convenience of description, the operating method of the display device 100 will be described by exemplifying a first block of a plurality of blocks and a first pixel of a plurality of pixels included in the first block, and the operating method may be equally applied to each of the plurality of blocks and each of the plurality of pixels.

Referring to FIG. 10, the display device 100 may divide a frame of an input video into a plurality of blocks (S100).

The controller 170 of the display device 100 or the block divider 910 included in the controller 170 may sequentially receive frames of a video to be displayed through the display unit 180, from a broadcast reception unit 130, a network interface unit 133, an external device interface unit 135, or a memory 140. The controller 170 may divide a received frame (current frame) into a plurality of blocks.

The display device 100 may sense a luminance value and a color value of a first block of the plurality of divided blocks (S110).

The controller 170 or the fixed region extractor 920 included in the controller 170 may sense the luminance value and the color value of the first block. As described in FIG. 9, the controller 170 may sense the luminance value and the color value of the first block by sensing an average luminance value and an average color value of at least some of pixels included in the first block.

The display device 100 may confirm whether the luminance value and the color value sensed with respect to the first block of the current frame are respectively the same as a luminance value and a color value of a first block of a previous frame (S120). As described in FIG. 9, the same luminance value and the same color value may mean a case where the luminance value and the color value sensed with respect to the first block of the current frame respectively are completely the same as the luminance value and the color value of the first block of the previous frame, and a case where a difference between the luminance values of the first blocks of the current frame and the previous frame and a difference between the color values thereof are greater than or equal to a reference value.

As a confirmation result, when the luminance value and the color value sensed with respect to the first block of the current frame are respectively the same as the luminance value and the color value of the first block of the previous frame (YES of S120), the display device 100 may increase a count with respect to the first frame (S130). For example, the controller 170 may increase the count with respect to the first block by one. That is, the count may mean the number of continuous frames in which the luminance values and the color values of the first blocks are the same.

On the contrary, when the sensed luminance value and the sensed color value are respectively differently from the luminance value and the color value of the first block of the previous frame (NO of S120), the display device 100 may reset the count with respect to the first frame (S122). That is, the count with respect to the first block may be reset to zero.

The display device 100 may compare the count with respect to the first block with a threshold count (S140). The threshold count may be a reference value for determining whether the first block is a fixed region.

When the count is greater than or equal to (or, is less than) the threshold count (NO of S140), the controller 170 of the display device 100 may perform operations S100 to S140 on a next frame. That is, the controller 170 may store a luminance value and a color value of each of blocks of the current frame in the memory 140 and sense a luminance value and a color value of each of blocks of the next frame. Then, the controller 170 may compare the luminance value and the color value with respect to the current frame with the luminance value and the color value with respect to the next frame, respectively.

When the count is greater than (or is equal to or greater than) the threshold count (YES of S140), the display device 100 may extract the first block as a fixed region.

The display device 100 may extract a maximum level from R, G, and B levels of the first pixel included in the first block extracted as the fixed region. When the extracted maximum level is higher (or equal to or higher) than a threshold level (YES of S152), the display device 100 may adjust each of the R, G, and B levels of the first pixel.

As described in FIG. 9, when the maximum level (having a maximum value) of the R, G, and B levels of the first pixel is higher than the threshold level, the controller 170 may reduce each of the R, G, and B levels by a certain ratio. For example, in a case where the R level is the maximum level, when only the R level is reduced by a certain ratio, a color of the first pixel may vary. Accordingly, the controller 170 may reduce a luminance value while maintaining the color of the first pixel, by reducing each of the R, G, and B levels of the first pixel by a certain ratio.

Meanwhile, the display device 100 may extract a maximum level from mixed color levels of the first pixel of the first block (S160). When the extracted maximum level is higher (or equal to or higher) than a threshold level (YES of S162), the display device 100 may adjust a current applied to the first pixel (S164).

Operations S150 to S154 (an embodiment of a first luminance adjustment) and operations S160 to S164 (an embodiment of a second luminance adjustment) may be performed in parallel, but only one embodiment may be selectively performed according to embodiments.

According to embodiments shown in FIG. 10, the display device 100 may divide a frame of a video into a plurality of blocks and may extract a fixed region by using a luminance value and a color value of each of the blocks, thereby preventing a reduction in a processing speed. In addition, the display device 100 may adjust R, G, and B levels or a current with respect to a pixel, a lifespan of which is likely to reduced, by using R, G, and B levels or mixed color levels of each of pixels of a fixed region, thereby minimizing a reduction in a lifespan of a corresponding pixel.

Hereinafter, an example related to the operating method of the display device 100 shown in FIG. 10 will be described with reference to FIGS. 11 to 15.

FIGS. 11 to 15 are illustrative views related to the operating method of the display device 100 shown in FIG. 10.

Figure 11:

Referring to FIG. 11, the display device 100 may generate a frame 1100 which is to be displayed on the display unit 180. For example, it is assumed that the frame 1100 includes a frame of a broadcast video received from the broadcast reception unit 130. For example, the frame of the broadcast video may include a logo displayed in a state of being fixed at a specific position. In addition, the frame 1100 may further include a menu screen or an advertisement popup window displayed based on user input or the like. The logo, the menu screen, and the advertisement popup window may be fixed at a specific position of the frame 1100 and thus may be displayed at a fixed position on the display device 100.

Figure 12:
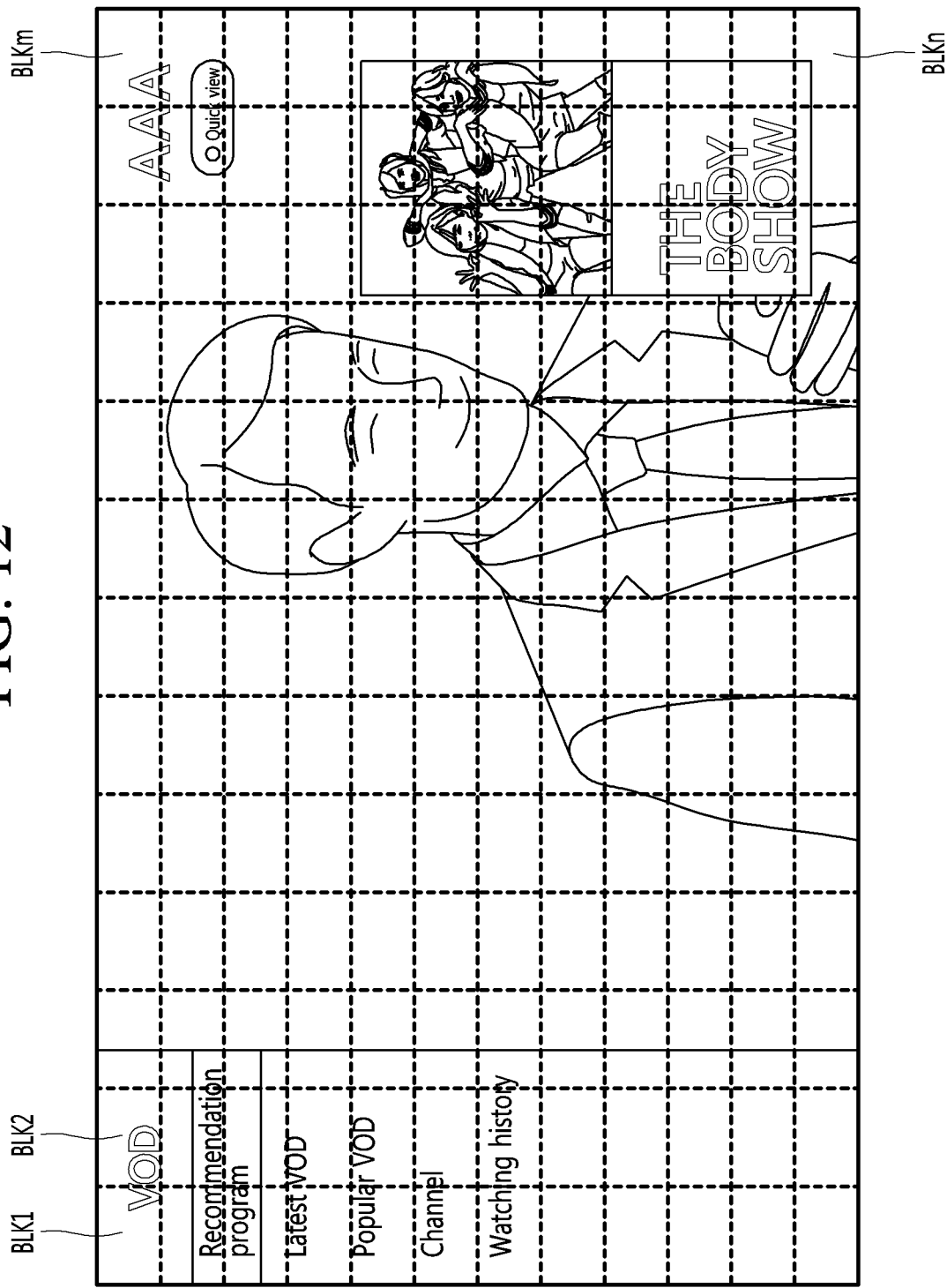

Referring to FIG. 12, the controller 170 may divide the frame 1100 into a plurality of blocks BLK1 to BLKn. For example, when resolution of the frame 1100 is UHD resolution of 3840×2160 and a block size thereof is 40×40, the number of the blocks may be 96×54, and n may be 5,184.

Figure 13:
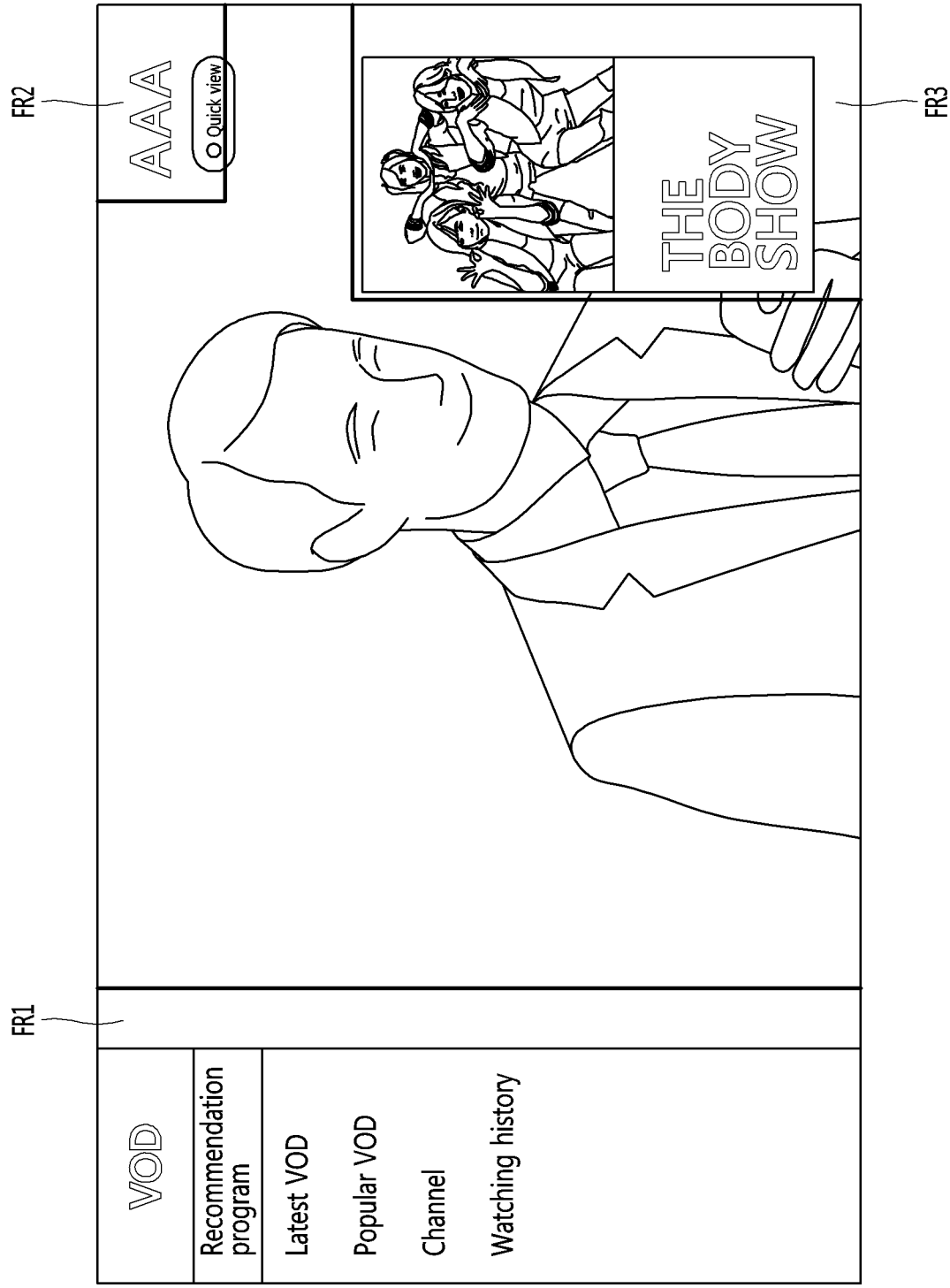

The controller 170 may sense a luminance value and a color value of each of the divided blocks BLK1 to BLKn. The controller 170 may sense the luminance value and the color value of each of the blocks BLK1 to BLKn of the frame 1100 with a luminance value and a color value of each of blocks BLK1 to BLKn of a previous frame, respectively. The controller 170 may increase a count with respect to blocks confirmed to have the sane luminance value and the same color level and may extract blocks, in which a count is higher (or equal to or higher) than a threshold count, as a fixed region. For example, as shown in FIG. 13, the controller 170 may extract one or more fixed regions FR1, FR2, and FR3 in the frame 1100. Each of the one or more fixed regions FR1, FR2, and FR3 may include one or more blocks, i.e., a plurality of pixels.

The controller 170 may adjust a luminance value of each of pixels by adjusting R, G, B levels and/or a current of each of the pixels based on the R, G, and B levels or mixed color levels of each of the pixels included in each of the extracted one or more fixed regions FR1, FR2, and FR3.

Figure 14:
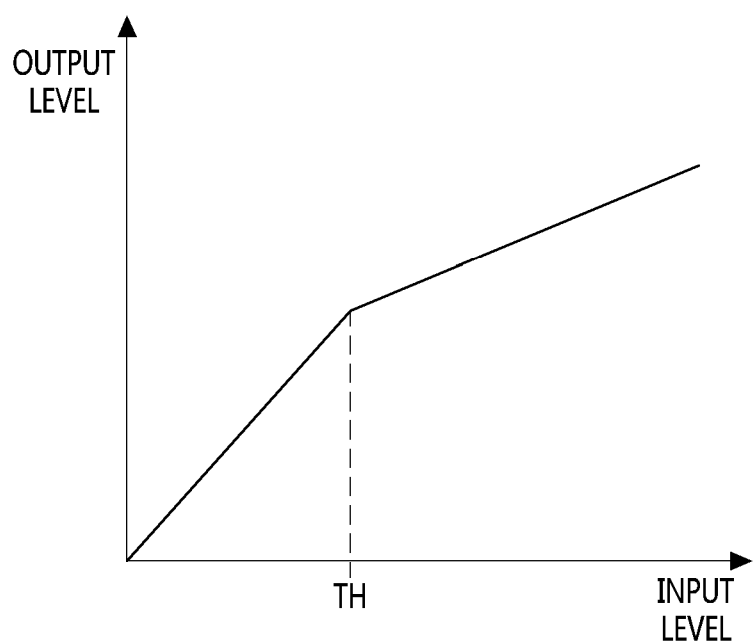

Referring to FIG. 14, the controller 170 may a reduce luminance value of each of pixels by reducing R, G, B levels (output levels) of each of the pixels, a maximum level of R, G, B levels (input levels) of which is higher than a threshold level TH, among the pixels included in each of the one or more fixed regions FR1, FR2, and FR3. The input levels may mean R, G, and B levels of an input frame, and the output levels may means R, G, and B levels of a frame output to the display unit 180.

Alternatively, the controller 170 may reduce a luminance value of each of pixels by reducing a current of each of the pixels, a maximum level of mixed color levels C, Y, and M of which is higher than the threshold level TH, among the pixels included in each of the one or more fixed regions FR1, FR2, and FR3.

Referring to FIG. 15, the controller 170 may output a frame 1500 including first to fifth items 1501 and 1505 having a reduced luminance value by adjusting R, G, B levels and/or a current of each of pixels respectively corresponding to the first to fifth items 1501 to 1505 included in one or more fixed regions FR1, FR2, and FR3. That is, the first to fifth items 1501 to 1505 may be continuously displayed at the same position of the display unit 180 during a certain number of frames. As the first to fifth items 1501 to 1505 are continuously displayed, the controller 170 may reduce R, G, and B levels and a current so as to minimize a reduction in a lifespan of corresponding pixels.

According to embodiments of the present invention, a reduction in a lifespan of pixels may be minimized by adjusting R, G, and B levels or a current value with respect to each of pixels of pixels of an OLED display device, outputting the same luminance value and the same color value during a certain number of continuous frames, thereby minimizing a phenomenon in which an afterimage is generated on a screen of the OLED display device. Therefore, it is possible to minimize user inconvenience caused by an afterimage phenomenon generated when a video is viewed using the OLED device.

In addition, the OLED display device may divide a frame of a video into a plurality of blocks, extract blocks having the same luminance value and the same color value during a certain number of continuous frames, and then, adjust R, G, and B levels or a current with respect to each of pixels included in the extracted fixed region. That is, the OLED display device may efficiently reduce an operation quantity for extracting the fixed region to prevent a reduction in a processing speed by extracting the fixed region based on a block rather than a pixel.

According to an embodiment, the above-described method may be implemented as a processor-readable code on a medium with a program recorded thereon. Examples of the computer readable recording medium include a hard disk, read-only memory (ROM), random-access memory (RAM), CD-ROMs, magnetic tapes, floppy disks, and optical data storage devices.

As can be seen from the foregoing, the display device is not limited to the configuration and method of the embodiments described above, but all or some components of the embodiments may be configured to be selectively combined such that various modifications of the embodiments can be implemented.

What is claimed is:

1. An organic light emitting diode display device comprising:
   a display unit comprising pixels each including an organic light emitting diode; and a controller configured to:
  divide a frame of a video into a plurality of blocks each including one or more pixels,
  sense a luminance value and a color value of each of the plurality of blocks,
  extract a fixed region including one or more blocks of the plurality of blocks based on the sensed luminance value and the sensed color value, and
  adjust a luminance value of one or more pixels in the extracted fixed region or a current applied to the one or more pixels based on pixel data of the one or more pixels.

2. The organic light emitting diode display device according to claim 1, wherein the controller senses a luminance value and a color value of a first block of the plurality of blocks by sensing an average luminance value and an average color level of one or more pixels included in the first block.

3. The organic light emitting diode display device according to claim 2, wherein the controller senses the luminance value and the color value of the first block by sensing an average luminance value and an average color level of at least some extracted from the one or more pixels included in the first block.

4. The organic light emitting diode display device according to claim 1, wherein, when a luminance value and a color value of a first block of the plurality of blocks are respectively the same as a luminance value and a color value in each of a certain number of continuous frames of the video, or when a difference between the luminance values and a difference between the color values are less than a reference value, the controller extracts the first block as the fixed region.

5. The organic light emitting diode display device according to claim 4, wherein the controller compares a luminance value and a color value of a first block of a current frame of the video with a luminance value and a color value with respect to a first block of a previous frame of the video,
  when the luminance values and the color values are the same, or a difference between the luminance values and a differences between the color values are less than a reference value, the controller increases a count with respect to the first block, and
  when the count is greater than or equal to the threshold count, the controller extracts the first block as the fixed region.

6. The organic light emitting diode display device according to claim 1, wherein the pixel data comprises R, G, and B levels or mixed color levels of each of the one or more pixels.

7. The organic light emitting diode display device according to claim 6, wherein the controller extracts a maximum level from R, G, and B levels of a first pixel of the one or more pixels included in the fixed region, and
  when the extracted maximum level is higher than or equal to a threshold level, the controller reduces each of the R, G, and B levels of the first pixel by a certain ratio.

8. The organic light emitting diode display device according to claim 6, wherein the controller extracts a maximum level from mixed color levels of a first pixel of the one or more pixels included in the fixed region, and
  when the extracted maximum level is higher than or equal to a threshold level, the controller reduces a current applied to the first pixel.

9. The organic light emitting diode display device according to claim 1, further comprising a memory configured to store the luminance value and the color value sensed with respect to each of the plurality of blocks.

10. The organic light emitting diode display device according to claim 1, further comprising a broadcast reception unit configured to receive the video.

11. An operating method of an organic light emitting diode display device, the operating method comprising:
  dividing a frame of an input video into a plurality of blocks each comprising a plurality of pixels;
  sensing a luminance value and a color value of each of the plurality of blocks;
  comparing the sensed luminance value and the sensed color value of each of the plurality of blocks with a luminance value and a color value of a corresponding block of a previous frame;
  extracting a fixed region with respect to the frame based on a comparison result; and
  adjusting the luminance value of each of the plurality of pixels or a current applied to each of the plurality of pixels based on pixel data of each of the plurality of pixels included in the fixed region.

12. The operating method according to claim 11, wherein the sensing comprises sensing an average luminance value and an average color value of the plurality of pixels included in each of the plurality of blocks.

13. The operating method according to claim 11, wherein the sensing comprises sensing an average luminance value and an average color level of at least some extracted from the plurality of pixels included in each of the plurality of blocks.

14. The operating method according to claim 13, wherein the extracting comprises extracting the fixed region comprising one or more blocks of the plurality of blocks, in which a difference between luminance values of the one or more blocks and the corresponding block of the previous frame and a difference between color values thereof are less than a reference value.

15. The operating method according to claim 14, wherein the extracting comprises:
  increasing a count with respect to each of the one or more blocks of the plurality of blocks, in which the difference between the luminance values of the one or more blocks and the corresponding block of the previous frame and the difference between color values thereof are less than the reference value; and
  extracting the fixed region comprising a block in which the count is greater than or equal to a threshold count.

16. The operating method according to claim 11, wherein the pixel data comprises R, G, and B levels or mixed color levels of each of the plurality of pixels.

17. The operating method according to claim 16, wherein the adjusting comprises:
  extracting a maximum level from the R, G, B levels of each of the plurality of pixels included in the fixed region; and
  reducing each of R, G, and B levels of one or more pixels by a certain ratio, the extracted maximum level of which is higher than or equal to a threshold level.

18. The operating method according to claim 16, wherein the adjusting comprises:
  extracting a maximum level from mixed color levels of each of the plurality of pixels included in the fixed region; and
  reducing a current applied to one or more pixels, the extracted maximum level of which is higher than or equal to a threshold level.

* * * * *